US007368350B2

(12) United States Patent
Olligs et al.

(10) Patent No.: US 7,368,350 B2
(45) Date of Patent: May 6, 2008

(54) MEMORY CELL ARRAYS AND METHODS FOR PRODUCING MEMORY CELL ARRAYS

(75) Inventors: Dominik Olligs, Dresden (DE); Torsten Mueller, Dresden (DE); Karl-Heinz Kuesters, Boxdorf (DE); Veronika Polei, Dresden (DE); Thomas Mikolajick, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 190 days.

(21) Appl. No.: 11/313,247

(22) Filed: Dec. 20, 2005

(65) Prior Publication Data

US 2007/0141799 A1 Jun. 21, 2007

(51) Int. Cl.
*H01L 21/336* (2006.01)
(52) U.S. Cl. ............... 438/262; 438/263; 438/264
(58) Field of Classification Search ........... 438/386, 438/263, 264, 257, 262
See application file for complete search history.

(56) References Cited

U.S. PATENT DOCUMENTS 5,907,781 A 5/1999 Chen et al.
6,686,242 B2 2/2004 Willer et al.
6,818,944 B2 11/2004 Lee
7,214,983 B2 * 5/2007 Han et al. ............... 257/324
2002/0000592 A1 * 1/2002 Fujiwara ............... 257/296
2003/0011007 A1 1/2003 Takashino
2003/0146465 A1 * 8/2003 Wu ............... 257/314
2005/0032310 A1 2/2005 Tsuji
2006/0211188 A1 * 9/2006 Lusky et al. ............... 438/201

FOREIGN PATENT DOCUMENTS

DE  101 10 150 A1  9/2002

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Michael Trinh
(74) *Attorney, Agent, or Firm*—Slater & Matsil, L.L.P.

(57) ABSTRACT

A method for fabricating stacked non-volatile memory cells and non-volatile memory cell arrays are disclosed. A semiconductor wafer is provided having a charge-trapping layer and a conductive layer deposited on the surface of the semiconductor wafer. Using a mask layer on top of the conductive layer, contact holes are formed into which a contact fill material is deposited. A further conductive layer is deposited on the surface of the semiconductor wafer and is patterned so as to form word lines. The contact fill material is connected to a contact plug using the contact holes with the contact fill material as a landing pad.

50 Claims, 10 Drawing Sheets

MEMORY CELL ARRAYS AND METHODS FOR PRODUCING MEMORY CELL ARRAYS

TECHNICAL FIELD

The present invention relates to methods for producing memory cell arrays and, in particular embodiments, to that are suitable to be used for planar EEPROMS for so-called "stand-alone" applications and for so-called "embedded" applications.

BACKGROUND

One of the most important development aims in the field of memory cells is the realization of increasingly smaller memory cells, i.e., the use of increasingly smaller chip areas per bit stored. Up to now, it has been considered advantageous to realize compact cells by means of buried, i.e., diffused bit lines. However, bit lines implemented as diffusion areas become increasingly highly resistive as their structural size decreases, since the diffusion depth must be scaled as well, so as to counteract the risk of a punch through between neighboring bit lines. The problem arising in this connection is that high-resistance bit lines permit only comparatively small cell blocks so that the utilization degree decreases and the advantage of the smaller memory cells, for which a higher process expenditure must be tolerated, diminishes.

One example of known memory cells with buried bit lines and a virtual-ground-NOR architecture is described in the article: "NROM: A Novel Localized Trapping, 2-Bit Nonvolatile Memory Cell", Boaz Eitan et al, IEEE Electron Device Letters, Vol. 21, No. 11, November 2000, pp. 543-545, which article is incorporated herein by reference. These concepts increase the resolution capabilities in semiconductor manufacturing. However, significant efforts and investments are needed to produce memories having the best possible resolution capabilities.

A further example of known memory cells is described in U.S. Pat. No. 6,686,242, which is incorporated herein by reference. A method for producing bit lines for a memory cell array comprises as a first providing a layer structure with a substrate having transistor wells implanted in a surface thereof. A sequence of storage medium layers is provided on the surface of the substrate, and a gate region layer is provided on the sequence of storage medium layers. Bit line recesses, which extend down to the sequence of storage medium layers, are produced in the gate region layer. Subsequently, insulating spacer layers are produced on lateral surfaces of the bit line recesses, whereupon a source/drain implantation is executed in the area of the bit line recesses, after a complete or partial removal of the sequence of storage medium layers.

Following this, the substrate is exposed completely in the area of the bit line recesses, if this has not yet been done prior to the implantation. Subsequently, metallization for producing metallic bit lines are produced on the exposed substrate. The metallization is insulated from the gate region layer by the insulating spacer layers.

SUMMARY OF THE INVENTION

In one aspect, the present invention provides methods and devices that permit the realization of very compact memory cells.

According to a first embodiment of the present invention, nonvolatile memory cells can be fabricated. A semiconductor wafer that includes a semiconductor substrate is provided. A structured charge-trapping layer is deposited on a surface of the semiconductor wafer. A plurality of gate lines are deposited over the structured charge-trapping layer. A plurality of buried bit lines are formed between the gate lines. Each of the buried bit lines is embedded in the semiconductor substrate. A first insulating layer is deposited within the region between the plurality of gate lines and the structured charge-trapping layer. The first insulating layer is etched to form first contact holes. The contact holes extend from the surface of the first insulating layer to the surface of the buried bit line. An insulating liner is deposited on the sidewalls of the first contact hole. A contact fill material is deposited within the first contact hole. The contact fill material fills the contact hole from the surface of the buried bit line up to a predetermined height within the first contact hole. A further insulating liner is deposited on the top side of the contact fill material. A second insulating layer is deposited on the surface of the semiconductor wafer. The second insulating layer and the further insulating liner are etched to form second contact holes. The second contact holes extend from the surface of the second insulating layer to the surface of the contact fill material. A contact plug is formed by filling the second contact holes with a conductive plug.

Another embodiment includes providing a semiconductor wafer. A charge-trapping layer is deposited on the surface of the semiconductor wafer and a conductive layer is deposited over the charge-trapping layer. A mask layer is deposited over the conductive layer and is patterned so as to form a plurality of structural elements. The conductive layer and the charge-trapping layer are patterned using the plurality of structural elements as a hard mask. A spacer oxide layer is deposited at least partially on the sidewalls of the plurality of gate lines, the structured charge-trapping layer and the structural elements of the mask layer. Ions are implanted using the spacer oxide layer as a mask to form a plurality of buried bit lines within the semiconductor wafer. A first insulating layer is deposited within the region between the plurality of gate lines and the structured charge-trapping layer. The first insulating layer is etched to form first contact holes. The contact holes extend from the surface of the first insulating layer to the surface of the buried bit line. An insulating liner is formed on the sidewalls of the first contact hole. A contact fill material is deposited within the first contact hole to fill the contact hole from the surface of the buried bit line up to a predetermined height within the first contact hole. A further insulating liner covers the top sides of the contact fill material. The structural elements of the mask layer are removed. A second insulating layer is deposited on the surface of the semiconductor wafer. The second insulating layer and the further insulating liner are etched to form second contact holes. The second contact holes extend from the surface of the second insulating layer to the surface of the contact fill material. A contact plug is formed by filling the second contact holes with a conductive plug.

Yet another solution includes providing a semiconductor wafer. A charge-trapping layer is deposited on the surface of the semiconductor wafer and a conductive layer is deposited on top of the charge-trapping layer. A mask layer is deposited on top of the conductive layer and patterned so as to form a plurality of structural elements. The conductive layer and the charge-trapping layer are patterned using the plurality of structural elements as a hard mask. A spacer oxide layer is deposited at least partially on the sidewalls of the structured conductive layer, the structured charge-trapping layer and the structural elements of the mask layer. Ions are implanted using the spacer oxide layer and the structural elements of the mask layer as a mask to form a plurality of buried bit lines within the semi-conductive substrate. A first insulating layer is deposited above the buried bit lines between the structured conductive layer and the structured charge-trapping layer. A contact hole is etched within the first insulating layer so that the contact hole is arranged above the buried bit lines. A contact fill material is formed within the contact hole. An insulating liner covers the top sides of the contact fill material. The structural elements of the mask layer are removed. A further conductive layer is deposited on the surface of the semiconductor wafer. The conductive layer and the further conductive layer are patterned so as to form word lines be arranged substantially different to the orientation of the bit lines. The conductive layer and the further conductive layer are removed between adjacent word lines and adjacent contact holes filled by the contact fill material above the plurality of buried bit lines. An insulating layer is deposited on the surface of the semiconductor wafer. The insulating layer and the insulating liner are etched to form second contact holes. The second contact holes extend from the surface of the second insulating layer to the surface of the contact fill material. A contact plug is formed by filling the second contact holes with a conductive plug.

Yet another solution is provided by a method for fabricating nonvolatile memory cells. A semiconductor wafer is provided. A charge-trapping layer is conformably deposited. A conductive layer is deposited on top of the charge-trapping layer. A mask layer is deposited on top of the conductive layer. The mask layer is patterned in order to form structural elements of the mask layer on the surface of the conductive layer. The conductive layer and the charge-trapping layer are etched using the structural elements of the mask layer as an etch mask in order to form gate lines from the conductive layer. An oxide spacer layer is formed on sidewalls of the gate lines, of the patterned charge-trapping layer, and the structural elements. Buried bit lines are formed by ion implantation using the oxide spacer layer as an implantation mask. A first insulating layer is deposited between the gate lines. The insulating layer is patterned so as to form contact holes. The structural elements of the mask layer are removed. A further conductive layer is conformably deposited on the surface of the semiconductor wafer. The conductive layer and the further conductive layer are patterned so as to form word lines in a direction substantially different to the orientation of the bit lines and filling the contact holes above the bit lines, wherein the conductive layer and the further conductive layer are removed between adjacent word lines so as to form a gate pattern above the charge-trapping layer for each memory cell and the conductive layer and the further conductive layer are removed in a region between adjacent contact holes filled by the further conductive layer.

Yet another embodiment is provided by a method for fabricating nonvolatile memory cells. A semiconductor wafer is provided. A charge-trapping layer is conformably deposited. A conductive layer is deposited on top of the charge-trapping layer. A mask layer is deposited on top of the conductive layer. The mask layer is patterned in order to form structural elements of the mask layer on the surface of the conductive layer. The conductive layer and the charge-trapping layer are etched using the structural elements of the mask layer as an etch mask in order to form gate lines from the conductive layer. An oxide spacer layer is deposited on sidewalls of the gate lines, of the patterned charge-trapping layer, and the structural elements. Buried bit lines are formed by ion implantation using the oxide spacer layer as an implantation mask. A first insulating layer is deposited between the gate lines. The insulating layer is patterned so as to form contact holes. A contact fill material is deposited to cover the contact holes above the bit lines. The structural elements of the mask layer are removed. A further conductive layer is conformably deposited on the surface of the semiconductor wafer. The conductive layer and the further conductive layer are patterned so as to form word lines in a direction substantially different to the orientation of the bit lines. The conductive layer and the further conductive layer are removed between adjacent word lines so as to form a gate pattern above the charge-trapping layer for each memory cell and the conductive layer and the further conductive layer are removed between adjacent contact holes filled by the contact fill material.

Yet another embodiment is provided by a method for fabricating nonvolatile memory cells where a semiconductor wafer is provided. A charge-trapping layer is conformably deposited. A conductive layer is deposited on top of the charge-trapping layer and a mask layer is deposited on top of the conductive layer. The mask layer is patterned in order to form structural elements of the mask layer on the surface of the conductive layer. The conductive layer and the charge-trapping layer are etched using the structural elements of the mask layer as an etch mask in order to form gate lines from the conductive layer. An oxide spacer layer is deposited on sidewalls of the gate lines, of the patterned charge-trapping layer, and the structural elements. Buried bit lines are formed by ion implantation using the oxide spacer layer as an implantation mask. A first insulating layer is formed between the gate lines. The insulating layer is patterned so as to form contact holes. The structural elements of the mask layer are removed. A further conductive layer is conformably deposited on the surface of the semiconductor wafer covering the contact holes above the bit lines as a contact fill material. The conductive layer and the further conductive layer are patterned so as to form word lines in a direction substantially different to the orientation of the bit lines. The conductive layer and the further conductive layer are removed between adjacent word lines so as to form a gate pattern above the charge-trapping layer for each memory cell and the conductive layer and the further conductive layer are removed between adjacent contact holes filled by the further conductive layer.

Yet another embodiment of the invention relates to a nonvolatile memory cell that includes a semiconductor wafer. A structured charge-trapping layer is arranged on a surface of the semiconductor wafer. A number of gate regions overlie the structured charge-trapping layer. A number of buried bit lines are embedded in the substrate and arranged outside the gate regions. A contact fill material is arranged above the surface of the buried bit line up to a predetermined height within a first insulating layer. A second insulating layer has second contact holes. The second contact holes extend from the surface of the second insulating layer to the surface of the contact fill material. A contact plug is disposed within the second contact holes.

Another embodiment nonvolatile memory cell includes a semiconductor wafer. A structured charge-trapping layer overlies a surface of the semiconductor wafer. A plurality of gate regions overlie the structured charge-trapping layer. A spacer oxide layer is disposed on the sidewalls of the structured conductive layer and the structured charge-trapping layer. A plurality of buried bit lines are disposed within the substrate and are self-aligned with the spacer oxide. A contact fill material is disposed above at least one of the plurality of buried bit lines. The contact fill material fills the contact hole from the surface of the buried bit line up to a predetermined height within the first contact hole. A further conductive layer is disposed on the surface of the semiconductor wafer being patterned so as to form word lines be arranged substantially perpendicular to the bit lines. The further conductive layer is removed between adjacent contact holes filled by the contact fill material above the plurality of buried bit lines. An insulating layer is disposed on the surface of the semiconductor wafer. The insulating layer has second contact holes that extend from the surface of the second insulating layer to the surface of the contact fill material. A contact plug is disposed within the second contact holes.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A presently preferred embodiment of the method for fabricating non-volatile memory cells having self-aligned bit line contacts and a non-volatile memory cell having self-aligned bit line contacts according to embodiments of the invention is discussed in detail below. It is appreciated, however, that the present invention provides many applicable inventive concepts that can be embodied in a wide variety of specific contexts. The specific embodiments discussed are merely illustrative of specific ways to apply the method and to apply the memory cell of the invention, and do not limit the scope of the invention.

In the following, embodiments of the method for fabricating non-volatile memory cells having self-aligned bit line contacts and a non-volatile memory cell having self-aligned bit line contacts are described with respect to NROM memories of the virtual ground architecture having a plurality of non-volatile memory cells.

Figure 1:
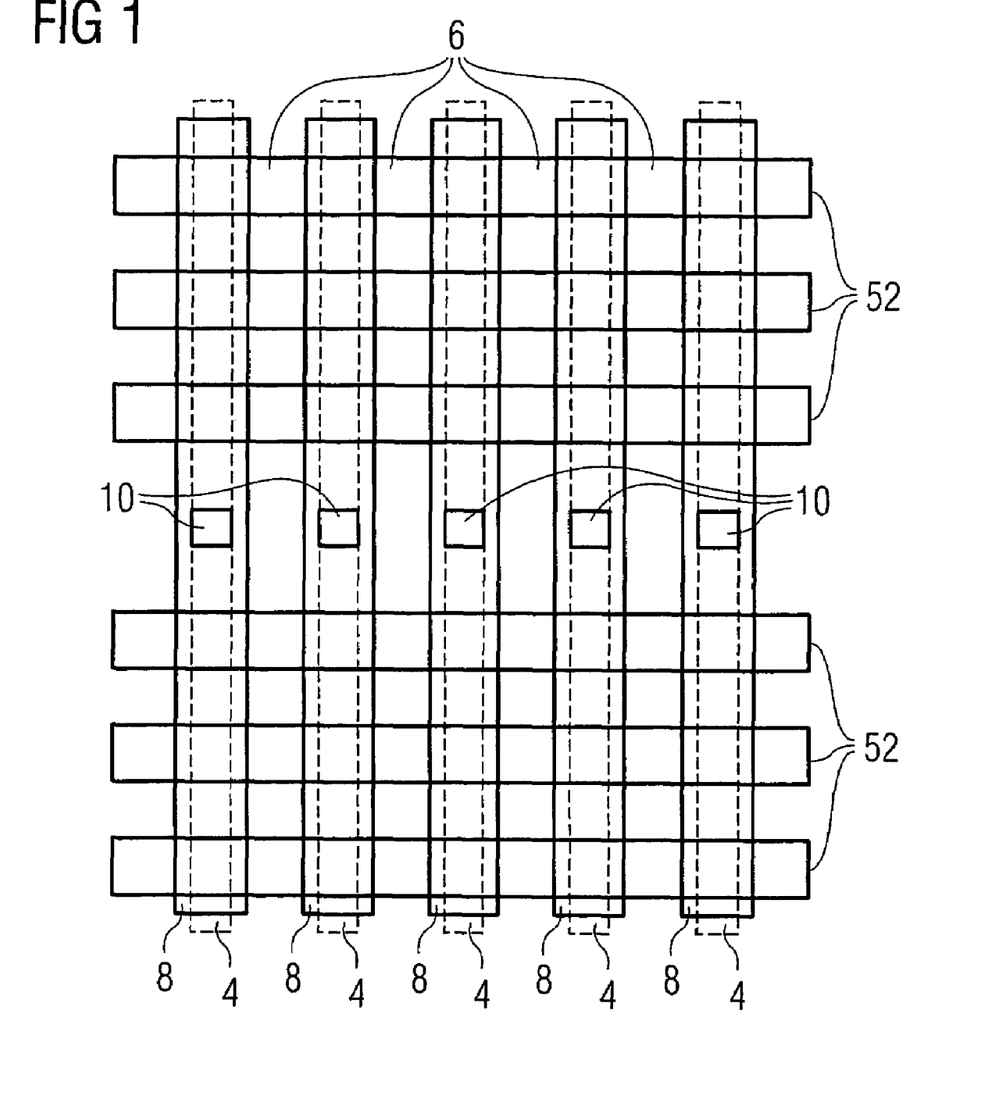
FIG. 1 schematically depicts a detail of a memory cell array according to an embodiment of the invention in a top view.

With respect to FIG. 1, a general layout of an NROM memory of the virtual ground architecture is shown in a top view. It should be appreciated that FIG. 1 merely serves as an illustration of fabricating non-volatile memory cells, i.e., the individual components shown in FIG. 1 are not true scale.

Before preferred embodiments for a memory cell array and for methods of producing a memory cell array will be explained in detail in the following making reference to FIGS. 2A to 4D, the general arrangement of the resulting bit lines and word lines of a virtual-ground-NOR architecture will be described making reference to FIG. 1.

FIG. 1 schematically shows sections of several word lines 52 that extend at right angles to bit lines 8 so that the word lines 52 define together with the bit lines 8 a lattice structure. In the crossing area between word lines 52 and the space between bit lines 8, gate regions of the memory cell are located. Gate regions are defined by a gate pattern including a patterned conductive layer formed on a charge-trapping layer. In FIG. 1, the broken lines represent a geometrically reduced area 4 above buried bit lines 8, whereas the solid lines represent source/drain diffusion regions in which the buried bit lines 8 are formed.

In such a virtual-ground architecture respective memory cells 6 are arranged below the word lines 52 between the bit lines 8, as indicated in FIG. 1 for the second word line 52. Below the word lines several gate regions having a charge-trapping layer are provided in this area, whereas the diffusion regions, i.e., source/drain implantations arranged below the bit lines define the source drain regions of a respective cell.

As shown in FIG. 1, the buried bit lines 8 are contacted using bit line contacts 10. The bit line contacts 10 are used to provide a contact from an interconnecting layer disposed on a dielectric layer to the buried bit lines 8. According to embodiments of the present invention, the buried bit lines are contacted using a bit line contact scheme employing a conductive plug. The conductive plug can be formed self-aligned to the bit lines 8, thus greatly reducing the risk of creating a short between adjacent bit lines 8.

Figure 2A:
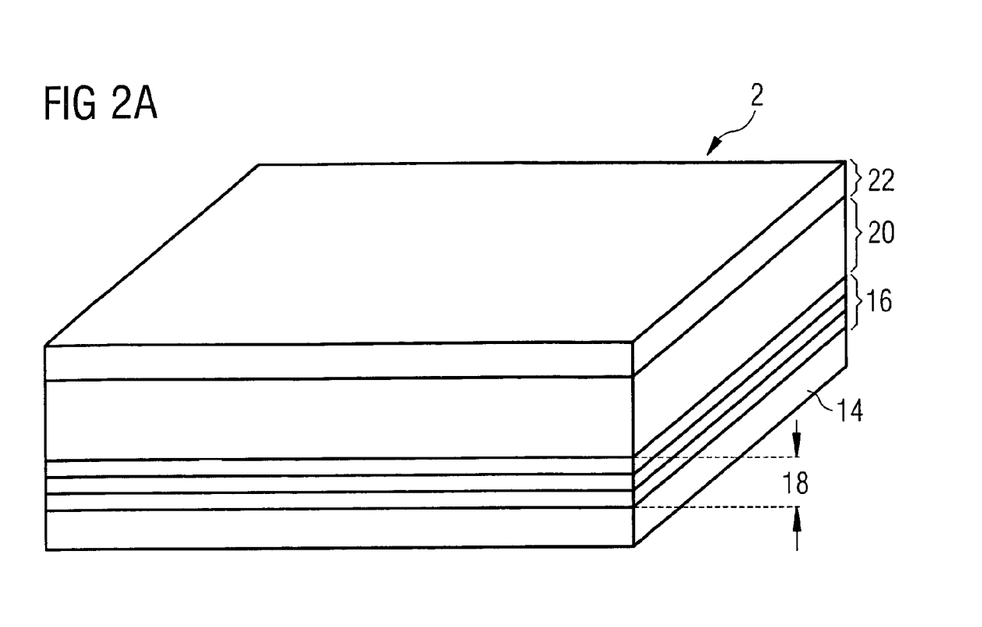
FIGS. 2A to 2K, collectively FIG. 2, schematically depict a memory cell array in a perspective side view when applying the method steps according to an embodiment of the invention.

Referring now to FIG. 2A, a method for forming non-volatile memory cells is illustrated. In FIG. 2A, a semiconductor wafer 2 is shown in a perspective side view. The side view of FIG. 2A (and also of the following FIGS. 2B to 2K) is a cross-sectional side view along a plane perpendicular to the surface of semiconductor wafer 2 and along adjacent bit line contacts perpendicular to bit lines 8.

The semiconductor wafer 2 has a semi-conductive substrate 14. Processing further includes conformably depositing a charge-trapping layer 16 on the semi-conductive substrate 14. The step of conformably depositing the charge-trapping layer 16 includes depositing an oxide/nitride/oxide-layer stack. As an example, the oxide/nitride/oxide-layer stack has a thickness 18 of less than about 50 nm, preferably in a range between about 5 nm and about 30 nm.

Next, a conductive layer 20 is deposited on top of the charge-trapping layer 16. As an example, the conductive layer 20 is provided as a polysilicon layer. Subsequently, a mask layer 22 is deposited on top of the conductive layer 20. As an example, the step of depositing a mask layer 22 on the surface of the conductive layer 20 can be employed by depositing a nitride layer. In general, the mask layer 22 should have a high etching resistance against the materials of the semi-conductive substrate 14, the charge-trapping layer 16 and the conductive layer 20.

In a next step, the mask layer 22 is lithographically patterned so as to form structural elements 24 of the mask layer 22 on the surface of conductive layer 20. The patterning of the mask layer 22 includes depositing a resist layer on the surface of the mask layer 22 and lithographically patterning the resist layer to form a patterned resist layer. After removing the mask layer 22 outside the patterned resist layer by etching, the patterned resist layer can be removed.

Now, the structural elements 24 of the mask layer 22 are used as an etch mask in order to etch the conductive layer 20 and the charge-trapping layer 16. This etching step is performed selective to the patterned mask layer 22 by employing an anisotropic etching step, e.g., by reactive ion etching. Other suitable etching processes might be used as well.

Figure 2B:
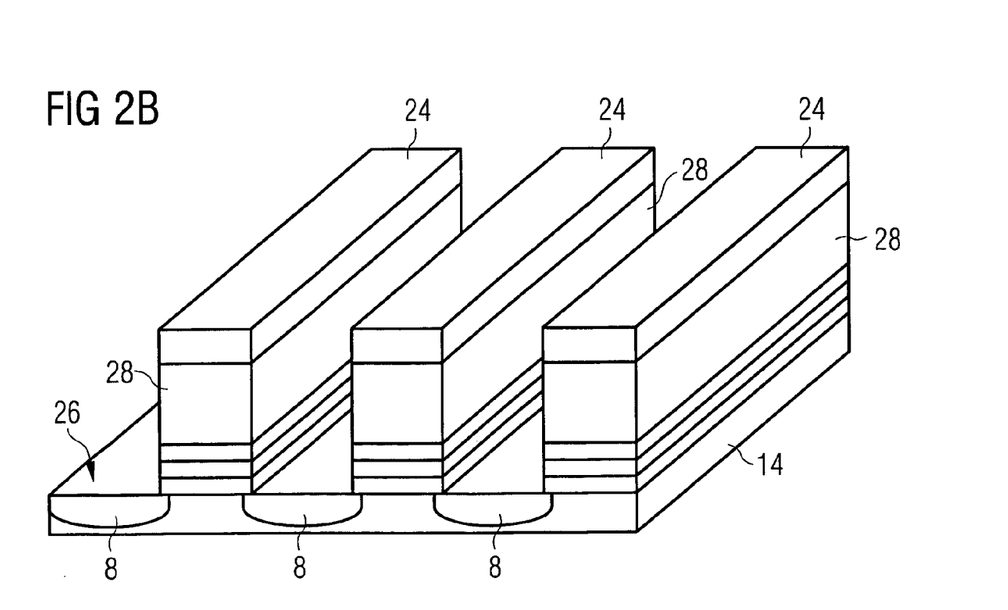

As a result, gate lines 28 are formed from the conductive layer 20 that cover the patterned charge-trapping layer 16 thus creating a region between the gate lines 28 whereas the surface 26 of the semi-conductive substrate 14 is uncovered. Within this region, diffusion regions 8 are formed by ion implanting. The diffusion regions 8 are formed from the surface 26 of the semi-conductive substrate 14 into a certain depth, as shown in FIG. 2B. The diffusion regions 8 have been shown with respect to FIG. 1 as well.

In summary, etching and implanting of the semiconductor wafer 2 creates gate lines 28, which are arranged in parallel to adjacent diffusion regions 8, as shown in FIG. 2B.

Figure 2C:
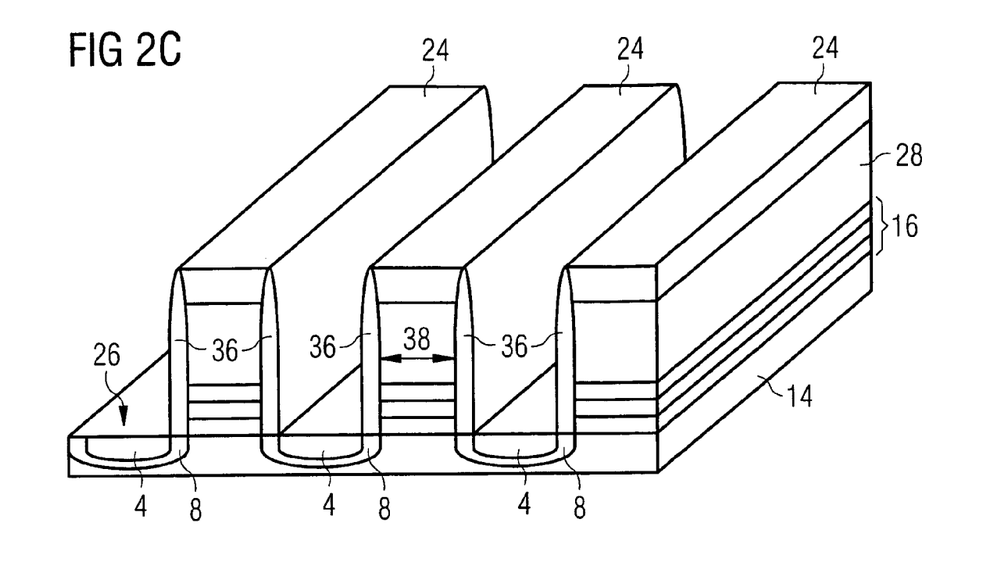

Referring now to FIG. 2C, the resulting structures after the next processing steps are shown. An oxide spacer layer 36 is deposited on the sidewalls 37 of the gate lines 28, the sidewalls of the patterned charge-trapping layer 16 and the sidewalls of the structural elements 24.

In a next step, the oxide spacer layer 36 is used as an implantation mask. Using ions being selected with a proper energy the buried bit lines 8 are formed as an implanted region in the substrate 14 between the sidewalls of the oxide spacer layer 36. This step is performed to achieve optimized junction implants for the source/drain-regions and thus the bit lines 8. Usually, this implantation is followed by a thermal anneal process sequence.

In order to enhance the conductivity of bit lines 8, the step of implanting the bit lines 8 can be followed by depositing a metal-containing layer on the surface of the bit lines 8. The metal-containing layer can be, e.g., a tungsten or tungsten silicone layer stack.

Figure 2D:
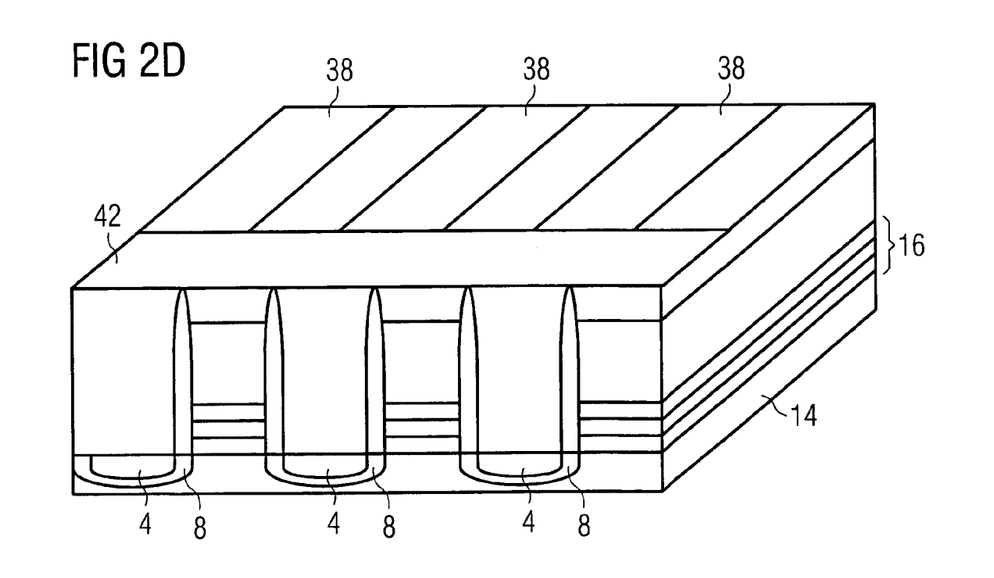

In a next step, a first insulating layer 38 is deposited between the gate lines 28, as shown in FIG. 2D. Depositing the first insulating layer 38 can be performed in the following way. First, the first insulating layer 38 is conformably deposited as a silicon dioxide layer. The first insulating layer 38 covers the recesses between the gate lines 28 and the structural elements 24 of the mask layer 22. Next, the first insulating layer 38 is removed from the top side of hard mask 22 by employing a chemical mechanical polishing step.

In a next step, the first insulating layer 38 is lithographically patterned, so as to form contact holes 40 at those positions that are to be connected by the bit line contact 10. The patterning of the first insulating layer 38 includes depositing a resist layer on the surface of the first insulating layer 38 and lithographically patterning the resist layer to form a patterned resist layer. The resist pattern is diagrammatically shown in FIG. 2D as reference numeral 42.

After removing the first insulating layer 38 outside the patterned resist layer by etching, the patterned resist layer can be removed.

Figure 2E:
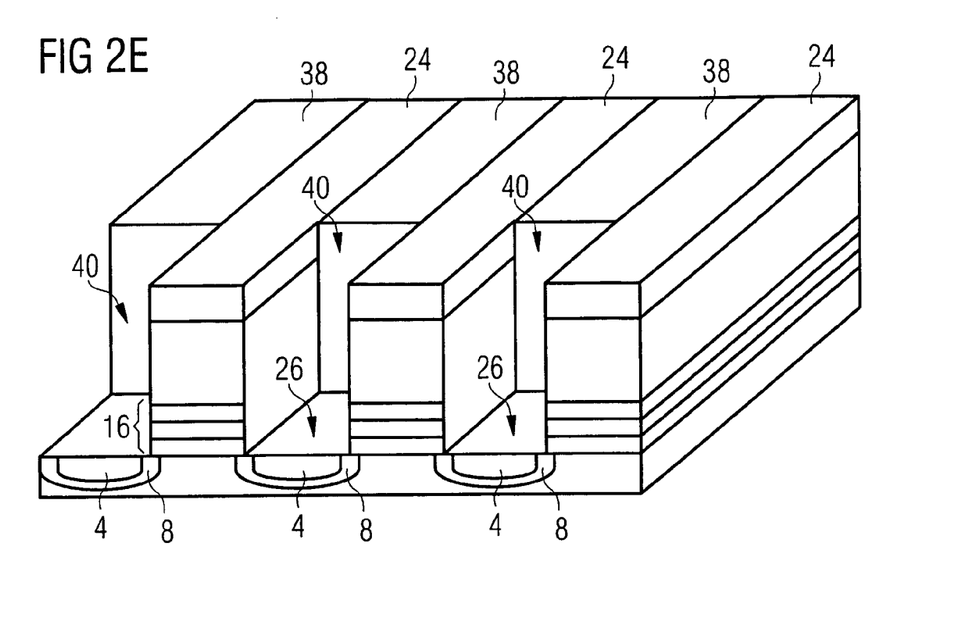

As shown in FIG. 2E, the first insulating layer 38 is partially removed, e.g., by employing a wet etching step. After this process step, the contact holes 40 are formed from the surface of the structural elements 24 of the mask layer 22 to the surface 26 of the semi-conductive substrate 14 in which bit lines 8 are embedded.

Figure 2F:
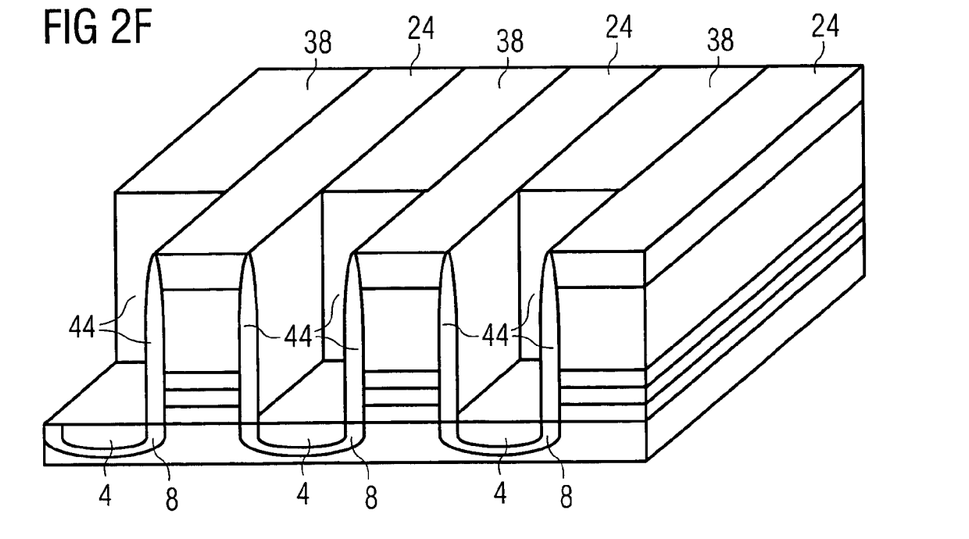

Next, an insulating liner 44 is deposited on the sidewalls of the contact holes 40, as shown in FIG. 2F. The first insulating liner 44 is deposited as a silicon-dioxide liner, for example. The first insulating liner 44 has a thickness, which is smaller than the diameter of the contact hole 40, so as to leave the area of the bit lines 8 uncovered.

Figure 2G:
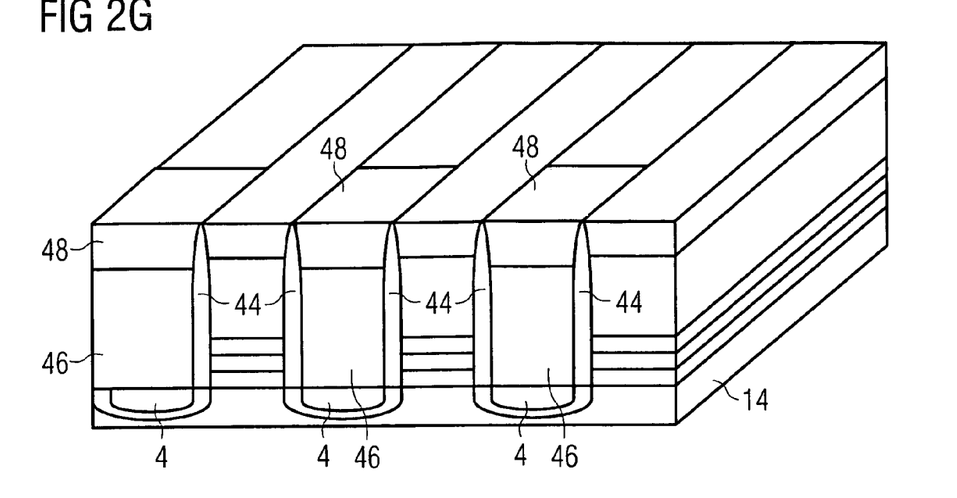

Referring now to FIG. 2G, processing further includes depositing a contact fill material 46 on the semiconductor wafer 2. The contact fill material 46 covers the contact holes 40 above the bit lines 8.

The step of depositing contact fill material 46 can be performed according to a first conceivable process sequence by conformably depositing a polysilicon layer. After depositing the polysilicon layer, a chemical-mechanical polishing step is performed in order to release the surface of the structural elements 24 of mask layer 22 and the surface of the first insulating layer 38. Next, the upper part of contact fill material 46 is removed employing an etching step, in order to form recesses. Accordingly, the contact fill material 46 is removed within the first contact hole 40 in a region from the surface of the first insulating layer 38 up to a predetermined height, as shown in FIG. 2G.

In a further conceivable process sequence, the contact fill material 46 is selectively grown on the surface 26 of the buried bit lines 8 up to the predetermined height within the first contact hole 40. Again, this step can include providing the contact fill material 46 as a polysilicon layer.

Processing further continues by filling the gap between the top surfaces of the contact fill material 46 up to the surface of the first insulating layer 38 with a further insulating liner 48. The second insulating liner 48 is deposited using the same material as for the first insulating liner 44. For example, a silicon-dioxide liner can be used.

In an alternative processing sequence, the contact fill material 46 is used as a starting point in order to create the second insulating liner 48. Accordingly, the selective growing or the recess etch are omitted. After the chemical-mechanical polishing step the contact fill material 46 is oxidized so as to create a non-conductive second insulating liner 48. For contact fill material 46 provided as a polysilicon layer, the step of oxidizing leads to a silicon-dioxide layer as second insulating liner 48.

The resulting structure is shown in FIG. 2G. The contact fill material 46 is now above the bit line 8 entirely covered by the first insulating liner 44 and second insulating liner 48. The contact fill material 46 provides a contact to the bit line 8. The above-described process sequence leads to a self-aligned fabrication of the contact fill material 46 which serves later as a landing pad during interconnection with metallic interconnecting wiring.

Figure 2H:
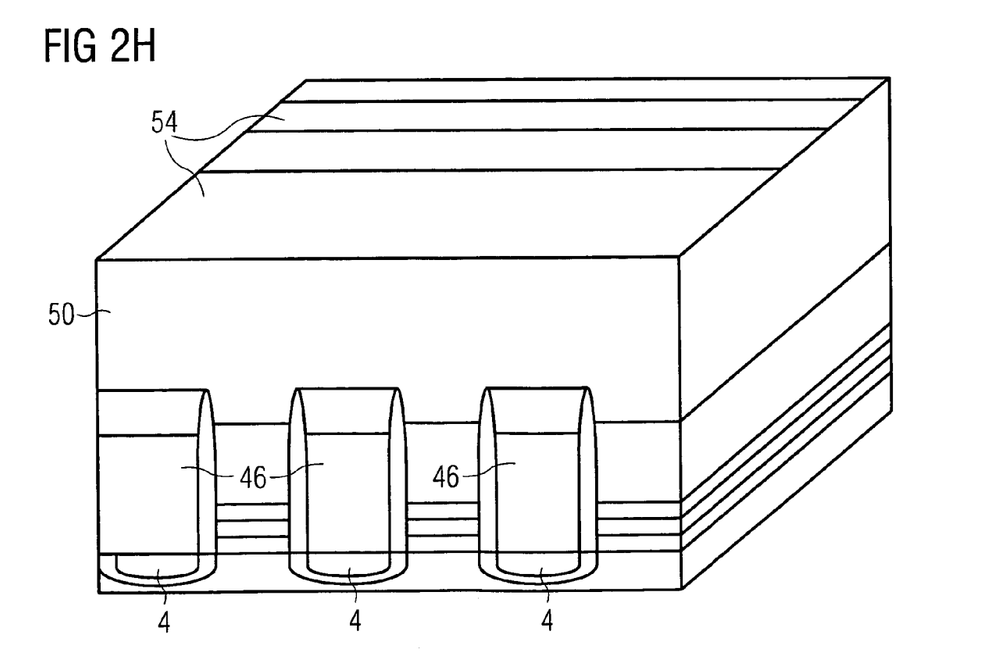

Processing continues by removing the structural elements 24 of the mask layer 22, e.g., by employing a wet-etch step. In a next step, a conductive layer 50 is conformably deposited on the surface of the semiconductor wafer 2, as shown in FIG. 2H. The conductive layer 50 is deposited as a polysilicon layer, for example. Preferably, the conductive layer 50 is composed of the same material as gate lines 28.

Figure 2I:
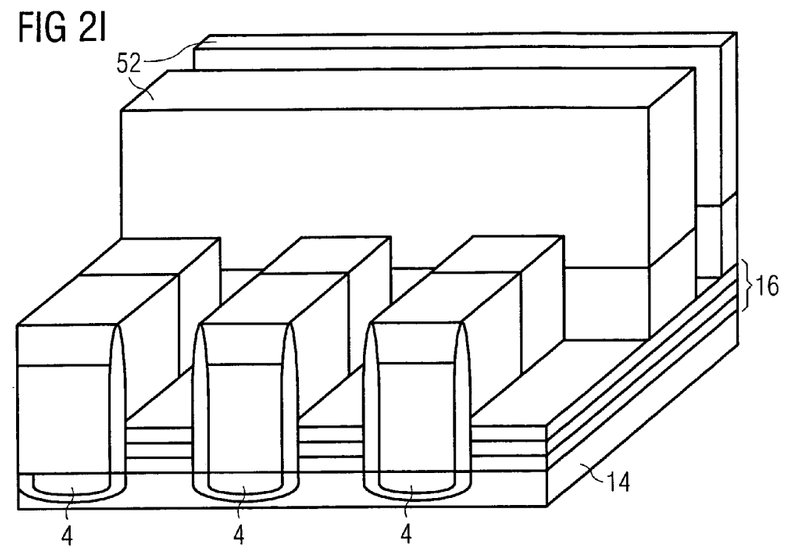

In a next step, the conductive layer 50 is lithographically patterned, so as to form word lines 52 in a direction perpendicular to the bit lines 8, as shown in FIG. 2I. The patterning of the conductive layer 50 includes depositing a resist layer on the surface of the conductive layer 50 and lithographically patterning the resist layer to form a patterned resist layer. The resist pattern is diagrammatically shown in FIG. 2H as reference numeral 54. As a result, the gate lines are removed outside the word lines. Accordingly, a gate pattern is formed. The gate pattern comprises the patterned gate lines 28, which are arranged for each memory cell above the charge-trapping layer 16 on the semi-conductive substrate 14.

After removing the conductive layer 50 outside the patterned resist layer by etching, the patterned resist layer can be removed. In another conceivable process sequence, the conductive layer is patterned using a hard mask that is structured employing a lithographic patterning of a resist layer, as described above.

After this process step, the conductive layer 50 forms the word line 52 for each stacked memory cell, as shown in FIG. 1. The word line 52 is arranged in a direction being substantially different to the orientation of the bit lines 8, preferably perpendicular to the bit lines 8. It should be noted that during etching of the conductive layer 50 the encapsulated contact fill material 46 remain on the surface 26 of bit line 8.

Figure 2J:
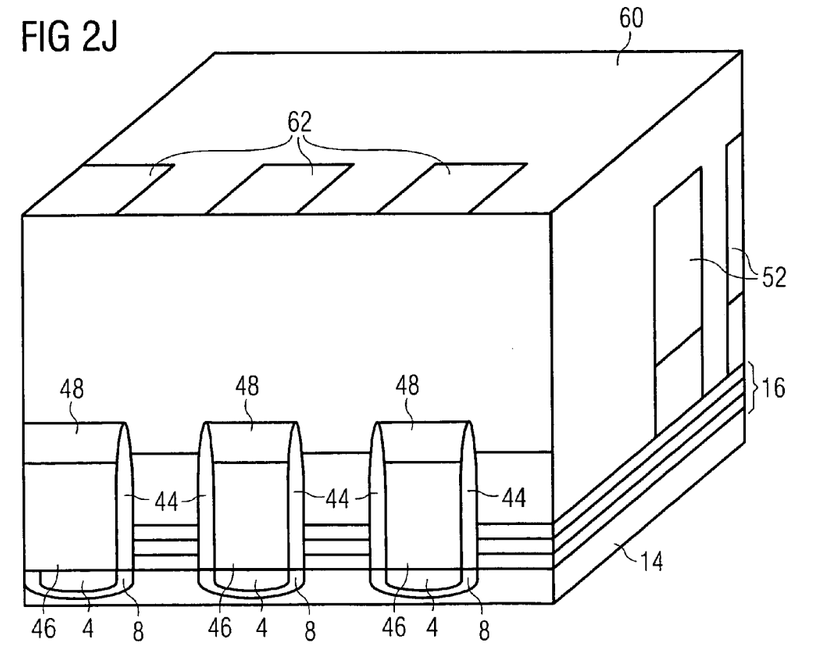
Figure 2K:
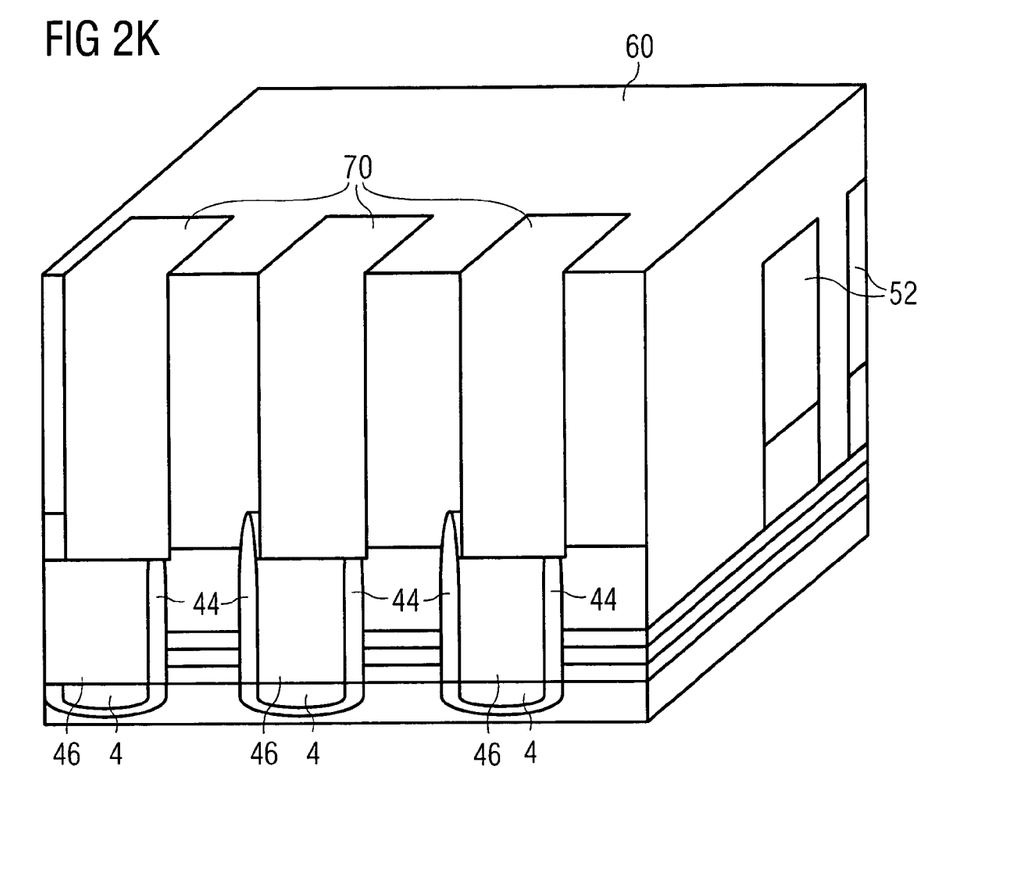

After etching the conductive layer 50 to form the word line 52, a further metal-containing layer can be arranged on top of the word line 52 in order to reduce the resistance of the word line 52 (not shown in FIG. 2K). A suitable material for the further metal-containing layer is tungsten silicide, for example.

Subsequently, a second insulating layer 60 is conformably deposited on the surface of the semiconductor wafer 2, covering the word lines 52, the bit lines 8, and the encapsulated contact fill material 46, as shown in FIG. 2J. As an example, the second insulating layer 60 is composed of silicon dioxide. Preferably, the second insulating layer 60 is composed of the same material as further insulating liner 48.

Further processing includes lithographically patterning of the second insulating layer 60, so as to form second contact holes 70 above the contact fill material 46, as shown in FIG. 2K. The patterning of the second insulating layer 60 includes depositing a resist layer on the surface of the second insulating layer 60 and lithographically patterning the resist layer to form a patterned resist layer. The resist pattern is diagrammatically shown in FIG. 2J as reference numeral 62.

After removing the second insulating layer 60 outside the patterned resist layer by etching, the patterned resist layer can be removed. After this process step, the second insulating layer 60 has contact holes 70 ranging from the surface of the second insulating layer 60 to the contact fill material 46. In a next step, the contact holes 70 are filled with conductive material so as to form at certain positions within the memory cell array a contact plug 10 to the bit lines 8 via the contact fill material 46, as shown in FIG. 1.

According to the process sequence described above, contacting the buried bit line 8 is performed using a self-aligned scheme. The self-aligned processing greatly reduces the risk of accidentally contacting elements surrounding the bit lines 8 by using the contact fill material 46 as a landing pad for the contact plug 10.

Figure 3:
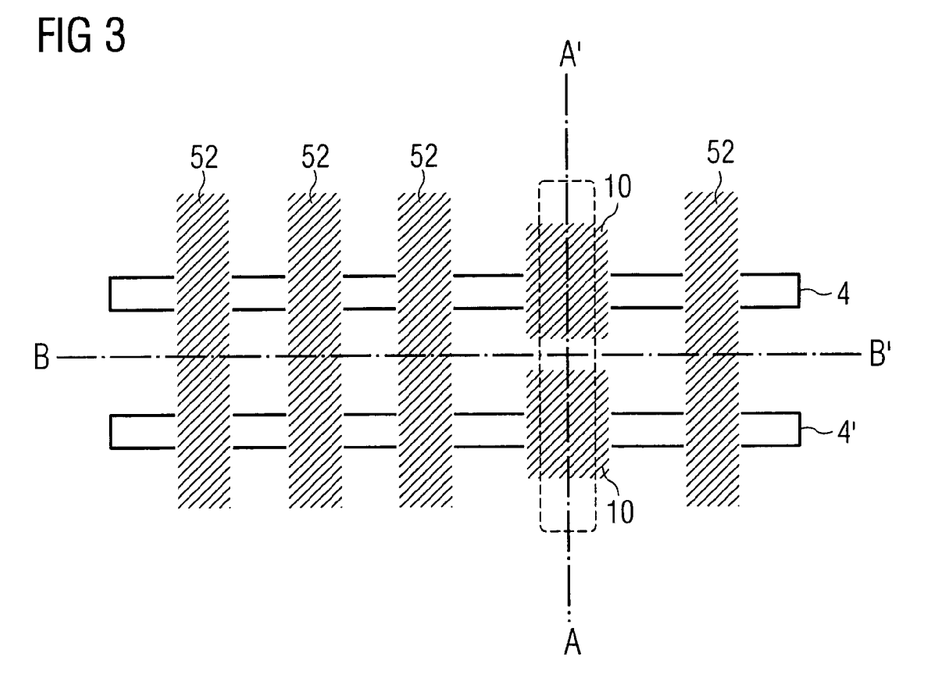
FIG. 3 schematically depicts a detail of a memory cell array according to an embodiment of the invention in a top view.

With respect to FIG. 3, a further embodiment of the invention is shown. Processing according to the embodiment described next uses several process steps being similar to the embodiment as described with respect to FIGS. 1 and 2. The main difference to the previously-described embodiment is that the conductive fill material and the word line are structured simultaneously.

FIG. 3 schematically shows sections of several word lines 52 that extend at right angles to bit lines 8 so that the word lines 52 define together with the bit lines 8 a lattice structure. In FIG. 3, the solid lines represent the buried bit lines 8 being arranged horizontally. As shown in FIG. 3, the buried bit lines 8 are again contacted using bit line contacts 10. The bit line contacts 10 are used to provide a contact from an interconnecting layer disposed on a dielectric layer to the buried bit lines 8.

Figure 4A:
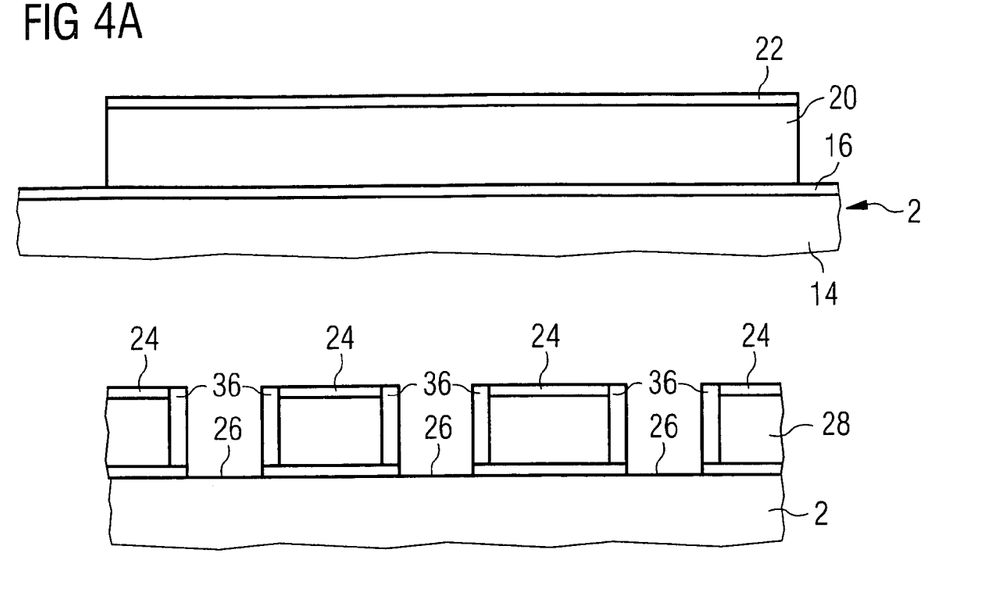
FIGS. 4A to 4D, collectively FIG. 4, schematically depict a memory cell array in a side view when applying the method steps according to a further embodiment of the invention.

Referring now to FIG. 4A, a method for forming non-volatile memory cells is illustrated. In FIG. 4A, a semiconductor wafer 2 is shown in a first side view (upper part of FIG. 4A) and in a second side view (lower part of FIG. 4A). The first side view of FIG. 4A (and also of the following FIGS. 4B to 4D), is a cross-sectional side view along a plane perpendicular to the surface of semiconductor wafer 2 and along the line B-B', as shown in FIG. 3. The second side view of FIG. 4A (and also of the following FIGS. 4B to 4D), is a cross-sectional side view along a plane perpendicular to the surface of semiconductor wafer 2 and along the line A-A', as shown in FIG. 3.

Again, the semiconductor wafer 2 has a semi-conductive substrate 14 onto which a charge-trapping layer 16 is deposited. The step of conformably depositing the charge-trapping layer 16 includes depositing an oxide/nitride/oxide-layer stack. As an example, the oxide/nitride/oxide-layer stack has a thickness 18 of less than about 50 nm, preferably in a range between about 5 nm and about 30 nm.

Next, a conductive layer 20 is deposited on top of the charge-trapping layer 16. As an example, the conductive layer 20 is provided as a polysilicon layer. Subsequently, a mask layer 22 is deposited on top of the conductive layer 20. As an example, the step of depositing a mask layer 22 on the surface of the conductive layer 20 can be employed by depositing a nitride layer. In general, the mask layer 22 should have a high etching resistance against the materials of the semi-conductive substrate 14, the charge-trapping layer 16 and the conductive layer 20.

In a next step, the mask layer 22 is lithographically patterned, so as to form structural elements 24 of the mask layer 22 on the surface of conductive layer 20. Now, the structural elements 24 of the mask layer 22 are used as an etch mask in order to etch the conductive layer 20 and the charge-trapping layer 16. This etching step is performed selective to the patterned mask layer 22 by employing an anisotropic etching step, e.g., by reactive ion etching. Other suitable etching processes might be used as well.

As a result, gate lines 28 are formed from the conductive layer 20 that cover the patterned charge-trapping layer 16 thus creating a region between the gate lines 28 whereas the surface 26 of the semi-conductive substrate 14 is uncovered. Within this region, diffusion regions can be formed by ion implantation, similar as described previously.

An oxide spacer layer 36 is deposited on the sidewalls 37 of the gate lines 28, the sidewalls of the patterned charge-trapping layer 16 and the sidewalls of the structural elements 24. In a next step, the oxide spacer layer 36 can be used as an implantation mask to form buried bit lines 8 as implanted regions in the substrate 14 between the sidewalls of the oxide spacer layer 36.

In summary, etching and implanting of the semiconductor wafer 2 creates gate lines 28 that are arranged in parallel, as shown in FIG. 4A.

Figure 4B:
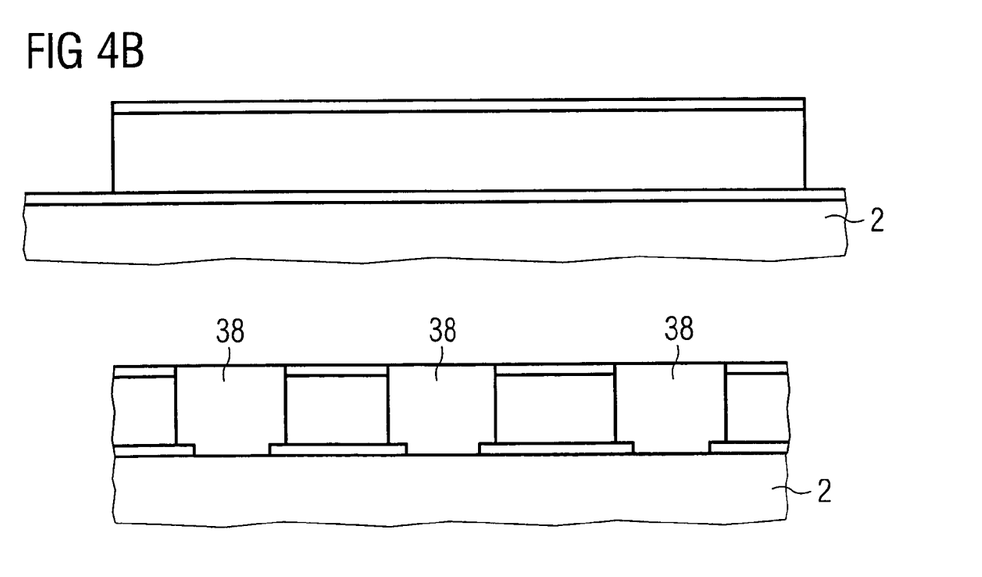

Referring now to FIG. 4B, the resulting structures after the next processing steps are shown.

A first insulating layer 38 is deposited between the gate lines 28, as shown in FIG. 4B. Depositing the first insulating layer 38 can be performed in the following way. First, the first insulating layer 38 is conformably deposited as a silicon dioxide layer. The first insulating layer 38 covers the recesses between the gate lines 28 and the structural elements 24 of the mask layer 22. Next, the first insulating layer 38 is removed from the top side of hard mask 22 by employing a chemical-mechanical polishing step.

Figure 4C:
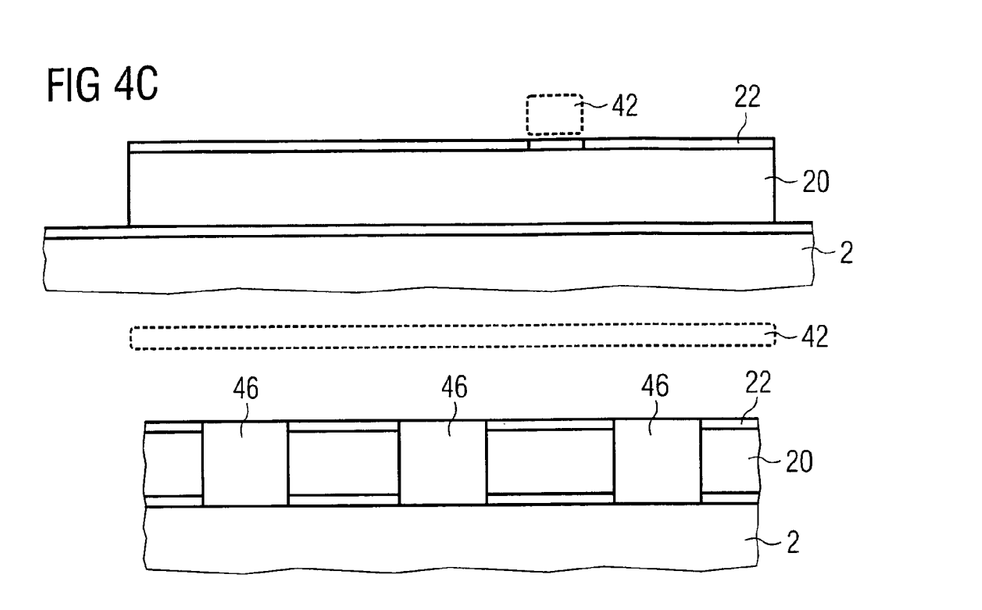

Referring now to FIG. 4C, the resulting structures after the next processing steps are shown.

In a next step, the first insulating layer 38 is lithographically patterned, so as to form contact holes 40 at those positions that are to be connected by the bit line contact 10. The patterning of the first insulating layer 38 includes depositing a resist layer on the surface of the first insulating layer 38 and lithographically patterning the resist layer to form a patterned resist layer. The resist pattern is diagrammatically shown in FIG. 4C as reference numeral 42.

After removing the first insulating layer 38 outside the patterned resist layer by etching to form contact holes 40 from the surface of the structural elements 24 of the mask layer 22 to the surface of the semi-conductive substrate 14 in which bit lines 8 are embedded, the patterned resist layer can be removed.

Processing further includes depositing a contact fill material 46 on the semiconductor wafer 2. The contact fill material 46 covers the contact holes 40 above the bit lines 8.

The step of depositing contact fill material 46 can be performed by conformably depositing a polysilicon layer. After depositing the polysilicon layer, a chemical-mechanical polishing step is performed in order to release the surface of the structural elements 24 of mask layer 22 and the surface of the first insulating layer 38.

The resulting structure is shown in FIG. 4C. The contact fill material 46 is now arranged above the bit line 8. The contact fill material 46 provides a contact to the bit line at the desired contact plug positions 10, as indicated in FIG. 3.

Processing continues by removing the structural elements 24 of the mask layer 22, e.g., by employing a wet-etch step. In a next step, a further conductive layer 50 is conformably deposited on the surface of the semiconductor wafer 2, as shown in FIG. 2H. The further conductive layer 50 is deposited as a polysilicon layer, for example. Preferably, the further conductive layer 50 is composed of the same material as the conductive layer forming the gate lines 28.

Figure 4D:
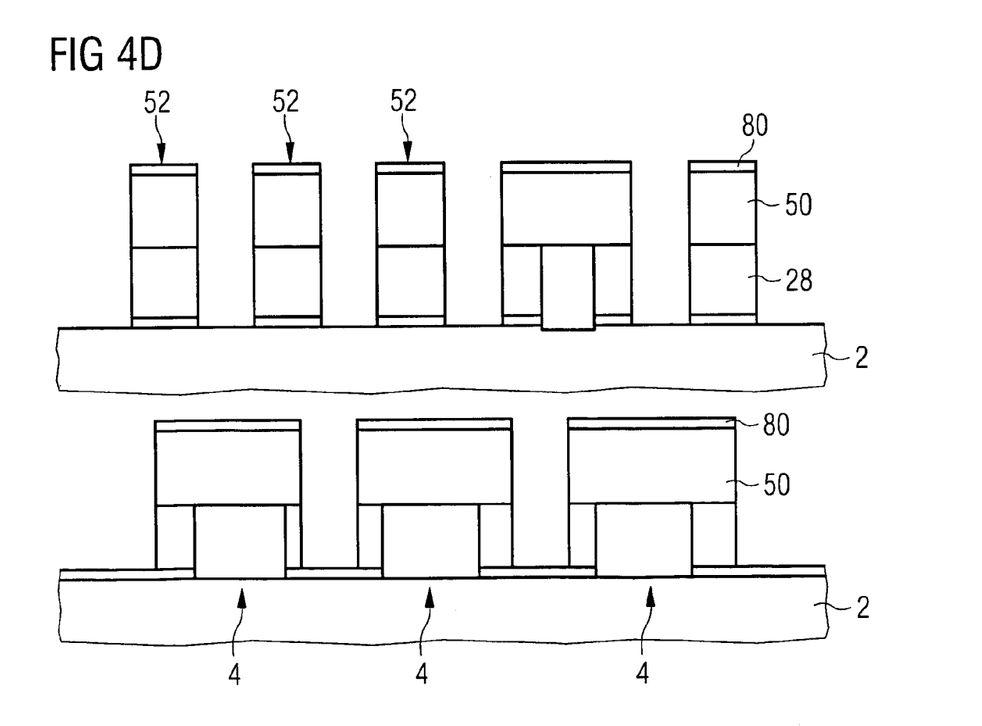

In a next step, the further conductive layer 50 is patterned, so as to form word lines 52 in a direction perpendicular to the bit lines 8, as shown in FIG. 4D. The patterning of the further conductive layer 50 includes depositing a further mask layer 80 on the surface of the further conductive layer 50 and patterning the further mask layer. After removing the further conductive layer 50 outside the patterned further mask layer 80 by etching, the patterned further mask layer 80 can be removed. After this process step, the further conductive layer 50 forms the word line 52 for each stacked memory cell, as shown in FIG. 1.

The word line 52 is arranged in a direction being substantially different to the orientation of the bit lines 8, preferably perpendicular to the bit lines 8. It should be noted that during etching of the further conductive layer 50 the contact fill material 46 remain on the surface 26 of bit line 8. Furthermore, the conductive layer is removed between adjacent contact holes, which are filled by the contact fill material above the buried bit lines. As a result, the gate lines are removed outside the word lines and a gate pattern is formed having a conductive gate above the charge-trapping layer for each memory cell.

In an alternative embodiment (not shown in FIGS. 4B and 4C), the structural elements 24 of the mask layer 22 are removed before depositing the contact fill material. As a consequence, the contact fill material 46 and the further conductive layer 50 can be deposited simultaneously, i.e., as a single layer. In this case, the step of depositing the further conductive layer 50 should be followed by a chemical-mechanical polishing step in order to planarize further conductive layer 50.

Subsequently, further dielectric layers and metal interconnecting layers can be provided as described previously. According to the embodiment described with respect to FIGS. 3 and 4, the formation of a contact to the bit lines 8 is performed in an etching step, simultaneously with forming the word lines 52.

Having described embodiments for a method for fabricating non-volatile memory cells and non-volatile memory cells, it is noted that modifications and variations can be made by persons skilled in the art in light of the above teachings. It is, therefore, to be understood that changes may be made in the particular embodiments of the invention disclosed, which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method for fabricating nonvolatile memory cells, the method comprising:
   providing a semiconductor wafer, said semiconductor wafer comprising a semi-conductive substrate having a surface;
   depositing a structured charge-trapping layer over the surface of said semiconductor wafer;
   depositing a plurality of gate lines over said structured charge-trapping layer;
   forming a plurality of buried bit lines between said gate lines, wherein each of said buried bit lines is embedded in said semi-conductive substrate;
   depositing a first insulating layer within the region between said plurality of gate lines and said structured charge-trapping layer;
   etching said first insulating layer to form first contact holes, said first contact holes extending from the surface of said first insulating layer to the surface of said buried bit lines;
   depositing an insulating liner on the sidewalls of said first contact holes;
   depositing a contact fill material within said first contact hole, said contact fill material filling said first contact holes from the surface of said buried bit lines up to a predetermined height within said first contact holes;
   depositing a further insulating liner on a top side of the contact fill material;
   depositing a second insulating layer over the surface of said semiconductor wafer;
   etching said second insulating layer and said further insulating liner to form second contact holes, said second contact holes extending from the surface of said second insulating layer to the surface of said contact fill material; and
   forming a contact plug by filling said second contact holes with a conductive material.

2. The method according to claim 1, wherein depositing said contact fill material within said first contact holes further comprises:
   conformably depositing said contact fill material on the surface of said semiconductor wafer;
   partially removing said contact fill material so as to expose the surface of said first insulating layer; and etching said contact fill material from the surface of said first insulating layer up to the predetermined height within said first contact holes.

3. The method according to claim 2, wherein partially removing said contact fill material comprises chemical-mechanical polishing of said contact fill material.

4. The method according to claim 1, wherein depositing said contact fill material within said first contact holes further comprises selectively growing said contact fill material on the surface of said buried bit lines up to the predetermined height within said first contact holes.

5. The method according to claim 1, wherein prior to depositing said second insulating layer on the surface of said semiconductor wafer, depositing a conductive layer on the surface of said semiconductor wafer, and patterning said conductive layer so as to form a plurality of word lines, said word lines arranged substantially perpendicular to said bit lines and having a certain distance to the region of said contact fill material within said first contact holes, wherein said gate lines are removed outside said word lines so as to form a gate pattern.

6. The method according to claim 5, wherein depositing a conductive layer on the surface of said semiconductor wafer further comprises depositing and patterning a metallic layer.

7. The method according to claim 1, wherein prior to forming a plurality of buried bit lines a spacer oxide layer is deposited on the sidewalls of said plurality of gate lines.

8. The method according to claim 7, wherein prior to forming a plurality of buried bit lines a spacer oxide layer is deposited on the sidewalls of said structured charge-trapping layer.

9. The method according to claim 7, wherein the spacer oxide layer is used as an implantation mask for forming said plurality of buried bit lines.

10. A method for fabricating nonvolatile memory cells, the method comprising:
  providing a semiconductor wafer, said semiconductor wafer comprising a semi-conductive substrate having a surface;
  depositing a charge-trapping layer over the surface of said semiconductor wafer;
  depositing a conductive layer over said charge-trapping layer;
  depositing a mask layer over said conductive layer;
  patterning said mask layer so as to form a plurality of structural elements;
  patterning said conductive layer and said charge-trapping layer using said plurality of structural elements as a hard mask;
  depositing a spacer layer at least partially on the sidewalls of said plurality of gate lines, said structured charge-trapping layer and said structural elements of said mask layer;
  implanting ions using said spacer layer as a mask to form a plurality of buried bit lines within said semiconductor substrate;
  depositing a first insulating layer within the region between said plurality of gate lines and said structured charge-trapping layer;
  etching said first insulating layer to form first contact holes, said first contact holes extending from the surface of said first insulating layer to the surface of said buried bit lines;
  depositing an insulating liner on the sidewalls of said first contact holes;
  depositing a contact fill material within said first contact holes, said contact fill material filling the first contact holes from the surface of said buried bit lines up to a predetermined height within said first contact holes;
  depositing a further insulating liner covering the top sides of the contact fill material;
  removing said structural elements of said mask layer;
  depositing a second insulating layer on the surface of said semiconductor wafer;
  etching said second insulating layer and said further insulating liner to form second contact holes, said second contact holes extending from the surface of said second insulating layer to the surface of said contact fill material; and
  forming a contact plug by filling said second contact holes with a conductive plug.

11. The method according to claim 10, wherein depositing a mask layer on the surface of said conductive layer comprises conformably depositing a nitride layer as said mask layer.

12. The method according to claim 10, wherein the step of patterning said mask layer comprises:
  depositing a resist layer on the surface of said mask layer;
  lithographically patterning said resist layer to form a patterned resist layer;
  removing said mask layer outside said patterned resist layer by etching; and
  removing said patterned resist layer.

13. The method according to claim 10, wherein depositing said charge-trapping layer comprises depositing an oxide/nitride/oxide-layer stack as said charge-trapping layer.

14. The method according to claim 13, wherein said oxide/nitride/oxide-layer stack has a thickness of less than about 50 nm.

15. The method according to claim 14, wherein said oxide/nitride/oxide-layer stack has a thickness in a range between about 5 nm and about 30 nm.

16. The method according to claim 10, wherein prior to depositing a second insulating layer on the surface of said semiconductor wafer, depositing a further conductive layer on the surface of said semi-conductive wafer, and patterning said further conductive layer so as to form a plurality of word lines, said word lines arranged substantially perpendicular to said bit lines and having a certain distance to the region of said contact fill material within first contact holes.

17. The method according to claim 16, wherein after depositing said further conductive layer, conformably depositing a metal-containing layer on the surface of said further conductive layer, and patterning said metal-containing layer so as to cover the top side of said word lines.

18. The method according to claim 17, wherein depositing said metal-containing layer comprises depositing a layer that comprises tungsten.

19. The method according to claim 17, wherein depositing said metal-containing layer comprises depositing a siliconized tungsten layer.

20. The method according to claim 17, wherein said metal-containing layer has a thickness of less than about 150 nm.

21. The method according to claim 20, wherein said metal-containing layer has a thickness in a range between about 20 nm and about 100 nm.

22. The method according to claim 10, wherein said conductive layer is deposited as a polysilicon layer.

23. The method according to claim 16, wherein said further conductive layer is deposited as a polysilicon layer.

24. The method according to claim 10, wherein depositing said first insulating layer comprises conformably depositing a silicon dioxide layer.

25. The method according to claim 24, wherein etching said first insulating layer comprises anisotropically etching said first insulating layer.

26. The method according to claim 24, wherein depositing said second insulating layer comprises conformably depositing a silicon dioxide layer.

27. The method according to claim 24, wherein etching said second insulating layer comprises anisotropically etching said second insulating layer.

28. A method for fabricating nonvolatile memory cells, the method comprising:
providing a semiconductor wafer, said semiconductor wafer comprising a semi-conductive substrate having a surface;
depositing a charge-trapping layer over the surface of said semiconductor wafer;
depositing a conductive layer over said charge-trapping layer;
depositing a mask layer over said conductive layer;
patterning said mask layer so as to form a plurality of structural elements;
patterning said conductive layer and said charge-trapping layer using said plurality of structural elements as a hard mask;
depositing a spacer layer at least partially on the sidewalls of said structured conductive layer, said structured charge-trapping layer and said structural elements of said mask layer;
implanting ions using said spacer layer and said structural elements of said mask layer as a mask to form a plurality of buried bit lines within said semi-conductive substrate;
depositing a first insulating layer above said buried bit lines between said structured conductive layer and said structured charge-trapping layer;
etching a contact hole within said first insulating layer, said contact hole being arranged above said buried bit lines;
forming a contact fill material within said contact hole;
depositing an insulating liner covering the top sides of the contact fill material;
removing said structural elements of said mask layer;
depositing a further conductive layer on the surface of said semiconductor wafer;
patterning said conductive layer and said further conductive layer so as to form word lines arranged at a different orientation relative to the orientation of said bit lines, wherein said conductive layer and said further conductive layer are removed between adjacent word lines and adjacent contact holes filled by said contact fill material above said plurality of buried bit lines;
depositing an insulating layer on the surface of said semiconductor wafer;
etching said insulating layer and said insulating liner to form second contact holes, said second contact holes extending from the surface of said second insulating layer to the surface of said contact fill material; and
forming a contact plug by filling said second contact holes with a conductive plug.

29. The method according to claim 28, wherein depositing said contact fill material within said first contact hole further comprises selectively growing said contact fill material on the surface of said buried bit line up to the predetermined height within said first contact hole.

30. The method according to claim 28, wherein depositing a contact fill material above at least one of said plurality of buried bit lines comprises:
conformably depositing a doped polysilicon layer as said contact fill material; and
recessing said contact fill material in order to form polysilicon plugs extending from the surface of said buried bit lines up to a predetermined height within said first contact holes.

31. A method for fabricating nonvolatile memory cells, the method comprising:
providing a semiconductor wafer, said semiconductor wafer comprising a semi-conductive substrate having a surface;
conformably depositing a charge-trapping layer;
depositing a conductive layer on top of said charge-trapping layer;
depositing a mask layer on top of said conductive layer;
patterning said mask layer in order to form structural elements of said mask layer on the surface of said conductive layer;
etching said conductive layer and said charge-trapping layer using said structural elements of said mask layer as an etch mask in order to form gate lines from said conductive layer;
depositing an oxide spacer layer on side walls of said gate lines, of said patterned charge-trapping layer, and said structural elements;
forming buried bit lines by ion implantation using said oxide spacer layer as an implantation mask;
depositing a first insulating layer between said gate lines;
patterning said insulating layer so as to form contact holes;
removing said structural elements of said mask layer;
conformably depositing a further conductive layer on the surface of said semiconductor wafer; and
patterning said conductive layer and said further conductive layer so as to form word lines in a direction substantially different to the orientation of said bit lines and filling said contact holes above said bit lines, wherein said conductive layer and said further conductive layer are removed between adjacent word lines so as to form a gate pattern above said charge-trapping layer for each memory cell and said conductive layer and said further conductive layer are removed in a region between adjacent contact holes filled by said further conductive layer.

32. The method according to claim 31, further comprising performing a chemical-mechanical polishing step of said further conductive layer after conformably depositing said further conductive layer.

33. The method according to claim 31, wherein said conductive layer is deposited as a polysilicon layer.

34. The method according to claim 33, wherein said further conductive layer is deposited as a polysilicon layer.

35. The method according to claim 31, wherein said mask layer and said further mask layer comprise silicon nitride.

36. A method for fabricating nonvolatile memory cells, the method comprising:
providing a semiconductor wafer, said semiconductor wafer comprising a semi-conductive substrate having a surface;
conformably depositing a charge-trapping layer;
depositing a conductive layer on top of said charge-trapping layer;
depositing a mask layer on top of said conductive layer;

patterning said mask layer in order to form structural elements of said mask layer on the surface of said conductive layer;

etching said conductive layer and said charge-trapping layer using said structural elements of said mask layer as an etch mask in order to form gate lines from said conductive layer;

depositing an oxide spacer layer on sidewalls of said gate lines, of said patterned charge-trapping layer, and said structural elements;

forming buried bit lines by ion implantation using said oxide spacer layer as an implantation mask;

depositing a first insulating layer between said gate lines;

patterning said insulating layer so as to form contact holes;

depositing a contact fill material covering said contact holes above said bit lines;

removing said structural elements of said mask layer;

conformably depositing a further conductive layer on the surface of said semiconductor wafer; and patterning said conductive layer and said further conductive layer so as to form word lines in a direction substantially different to the orientation of said bit lines, wherein said conductive layer and said further conductive layer are removed between adjacent word lines so as to form a gate pattern above said charge-trapping layer for each memory cell and said conductive layer and said further conductive layer are removed between adjacent contact holes filled by said contact fill material.

37. The method according to claim 36, further comprising:
depositing a further mask layer;
structuring said further mask layer to form further structural elements; and
patterning said conductive layer and said further conductive layer using said further structural elements as a mask.

38. The method according to claim 36, wherein patterning said insulating layer so as to form contact holes is performed lithographically using a photo mask, said photo mask having a line-shaped structural element so as to selectively structure the insulating layer along a stripe being arranged substantially perpendicular to said buried bit lines.

39. The method according to claim 36, wherein said conductive layer is deposited as a polysilicon layer.

40. The method according to claim 39, wherein said further conductive layer is deposited as a polysilicon layer.

41. The method according to claim 40, wherein said contact fill material is conformably deposited as a polysilicon layer before performing a chemical-mechanical polishing step of said polysilicon layer.

42. The method according to claim 37, wherein said mask layer and said further mask layer comprise silicon nitride.

43. The method according to claim 42, wherein patterning said further mask layer is performed lithographically using a photo mask, said photo mask having a line-shaped structural element so as to structure the further conductive layer as a stripe arranged substantially perpendicular to said buried bit lines.

44. The method according to claim 36, wherein depositing said conductive layer comprises;
conformably depositing said conductive layer; and
chemical-mechanical polishing of said conductive layer.

45. A method for fabricating nonvolatile memory cells, the method comprising:
providing a semiconductor wafer, said semiconductor wafer comprising a semi-conductive substrate having a surface;

conformably depositing a charge-trapping layer;

depositing a conductive layer over said charge-trapping layer;

depositing a mask layer over said conductive layer;

patterning said mask layer in order to form structural elements of said mask layer on the surface of said conductive layer;

etching said conductive layer and said charge-trapping layer using said structural elements of said mask layer as an etch mask in order to form gate lines from said conductive layer;

depositing a spacer layer on sidewalls of said gate lines, of said patterned charge-trapping layer, and said structural elements;

forming buried bit lines by ion implantation using said spacer layer as an implantation mask;

depositing a first insulating layer between said gate lines;

patterning said insulating layer so as to form contact holes;

removing said structural elements of said mask layer;

conformably depositing a further conductive layer on the surface of said semiconductor wafer covering said contact holes above said bit lines as a contact fill material; and patterning said conductive layer and said further conductive layer so as to form word lines in a direction substantially different to the orientation of said bit lines, wherein said conductive layer and said further conductive layer are removed between adjacent word lines so as to form a gate pattern above said charge-trapping layer for each memory cell and said conductive layer and said further conductive layer are removed between adjacent contact holes filled by said further conductive layer.

46. The method according to claim 45, wherein said conductive layer is deposited as a polysilicon layer.

47. The method according to claim 45, wherein said further conductive layer is deposited as a polysilicon layer.

48. The method according to claim 45, further comprising, after said contact further conductive layer is conformably deposited, performing a chemical-mechanical polishing step of said further conductive layer.

49. The method according to claim 45, wherein said mask layer comprises silicon nitride.

50. The method according to claim 45, wherein said further conductive layer comprises a metal or a metal silicon compound.

* * * * *